United States Patent [19]

Helle et al.

[11] 4,412,188

[45] Oct. 25, 1983

[54] TEMPERATURE-COMPENSATED CRYSTAL OSCILLATOR

[75] Inventors: Jacques Helle; Guy Caret, both of Sartrouville, France

[73] Assignee: Compagnie d'Electronique et de Piezo-Electricite C.E.P.E., Sartrouville, France

[21] Appl. No.: 236,630

[22] Filed: Feb. 20, 1981

[30] Foreign Application Priority Data

Feb. 22, 1980 [FR] France ................................ 80 03979

[51] Int. Cl.³ .......................... H03B 5/36; H03L 1/02
[52] U.S. Cl. ........................................ 331/176; 331/66
[58] Field of Search ...................... 331/176, 66, 116 R, 331/158

[56] References Cited

U.S. PATENT DOCUMENTS

| | | | |
|---|---|---|---|
| 3,397,367 | 8/1968 | Steel et al. | 331/176 X |
| 3,454,903 | 7/1969 | Page | 331/176 X |
| 4,020,426 | 4/1977 | Hellé | 331/176 X |
| 4,107,629 | 8/1978 | Stone, Jr. | 331/176 X |

Primary Examiner—Siegfried H. Grimm
Assistant Examiner—Tim A. Wiens
Attorney, Agent, or Firm—Cushman, Darby & Cushman

[57] ABSTRACT

A frequency regulated crystal oscillator with (1) an oscillating circuit made up of an amplifier, piezoelectric crystal and voltage controls capacitor, and (2) a two-part compensating circuit connected to the terminals of the variable capacitor, each part having thermistors whose resistance varies with temperature to produce complementary signals and which are shunted with electrical resistors.

4 Claims, 14 Drawing Figures

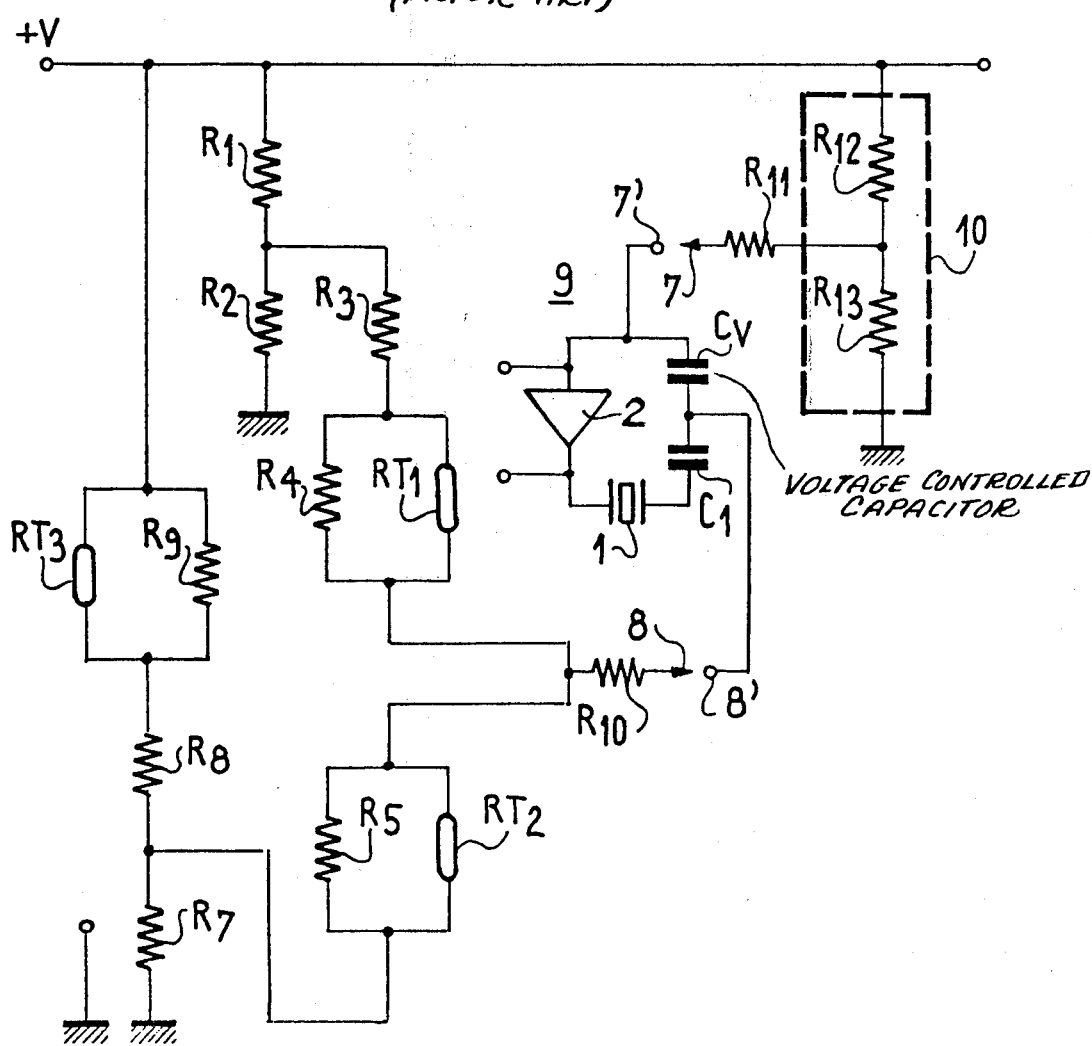

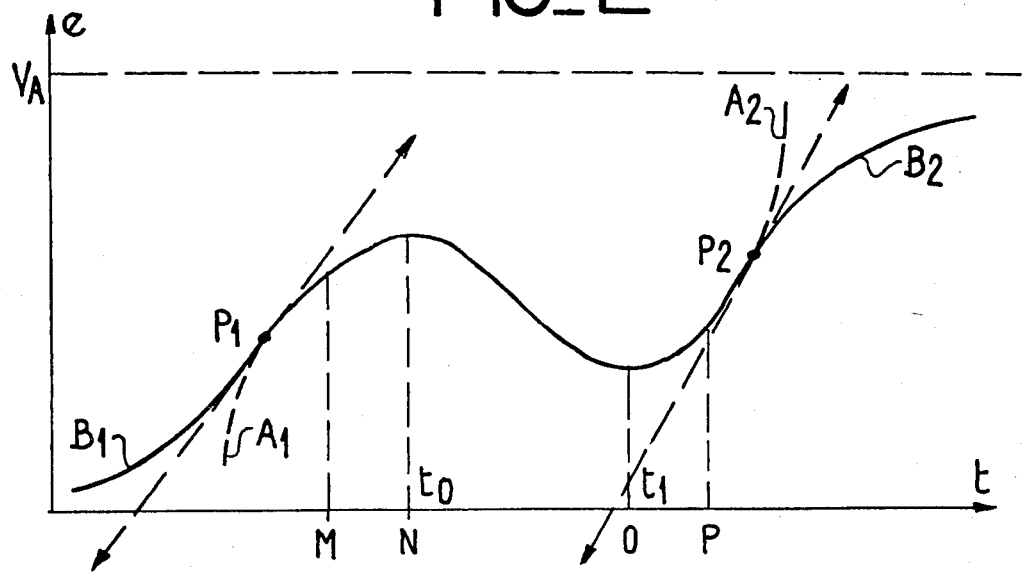
FIG_2
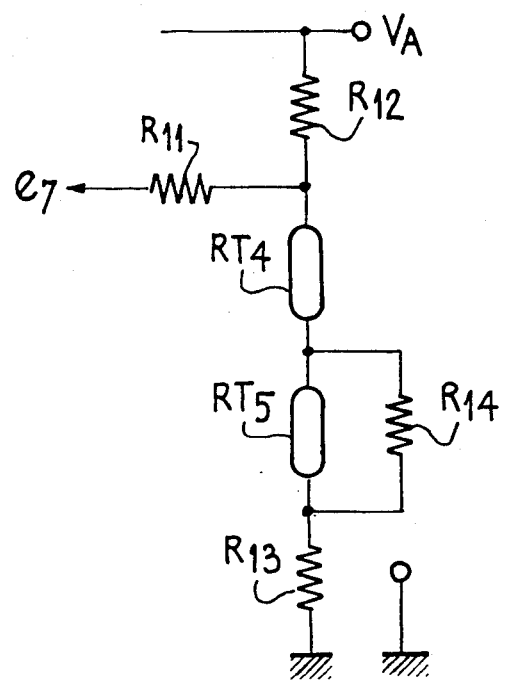
FIG_3

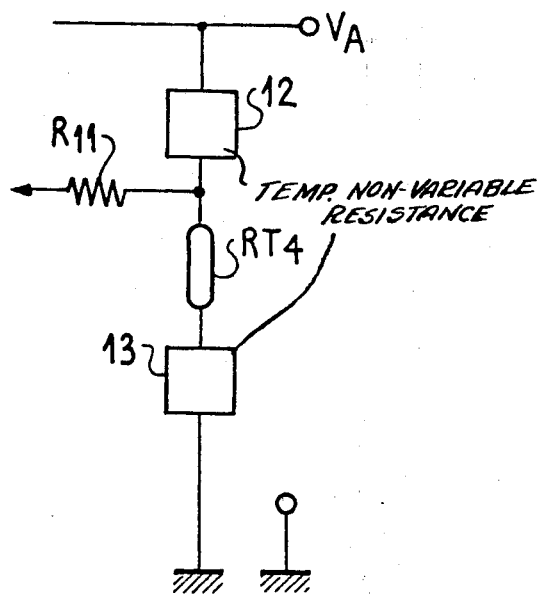
FIG_4·A
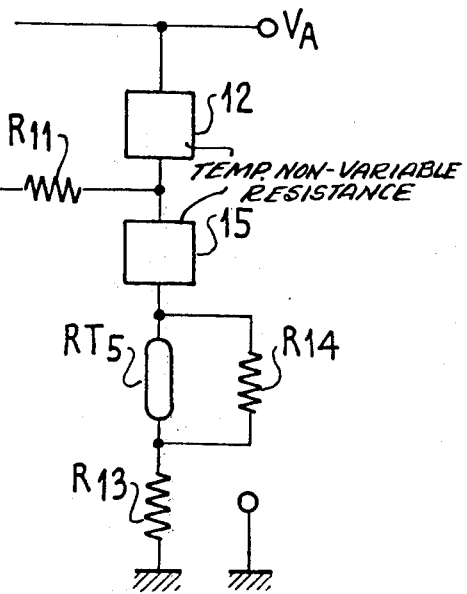
FIG_4·B
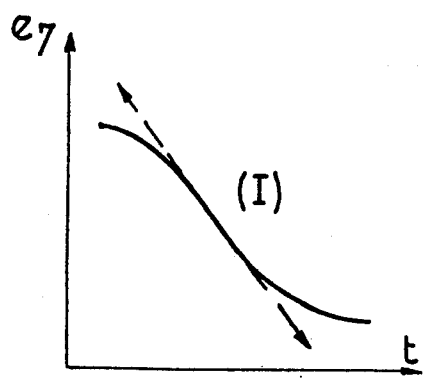
FIG_5·A
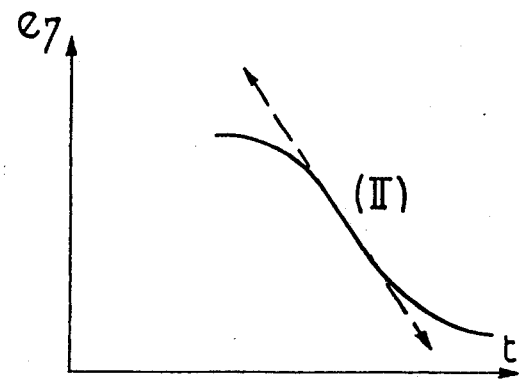
FIG_5·B

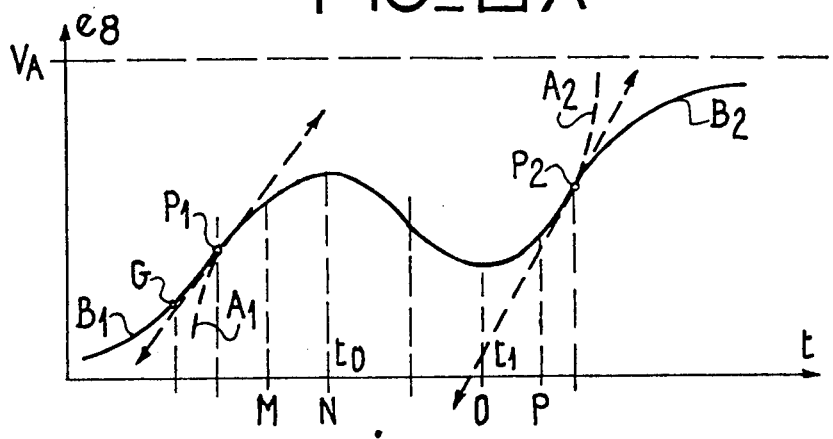
FIG_6-A
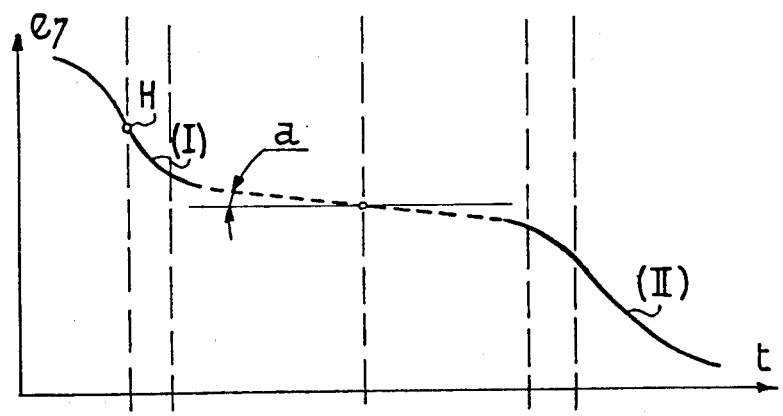
FIG_6-B
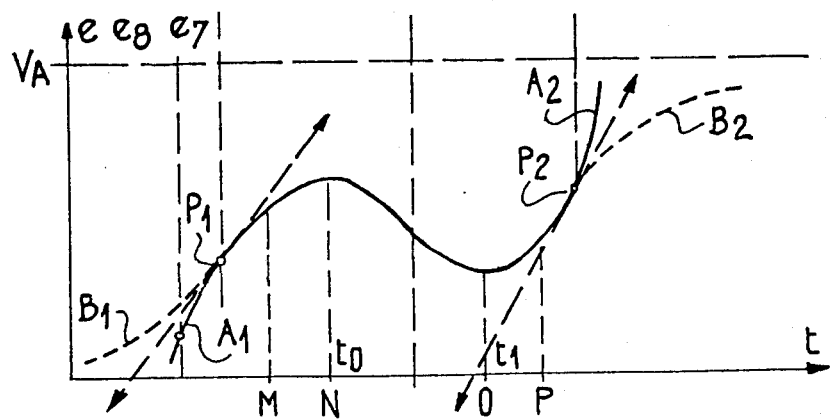
FIG_6-C

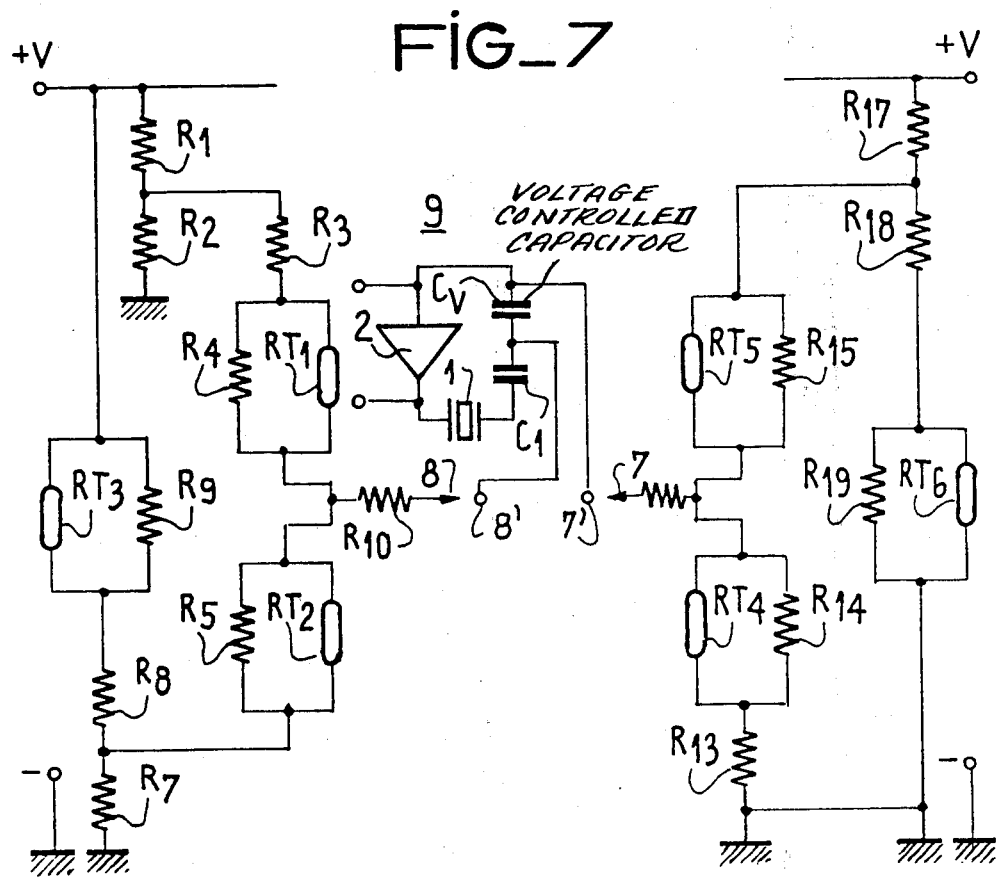
FIG_7
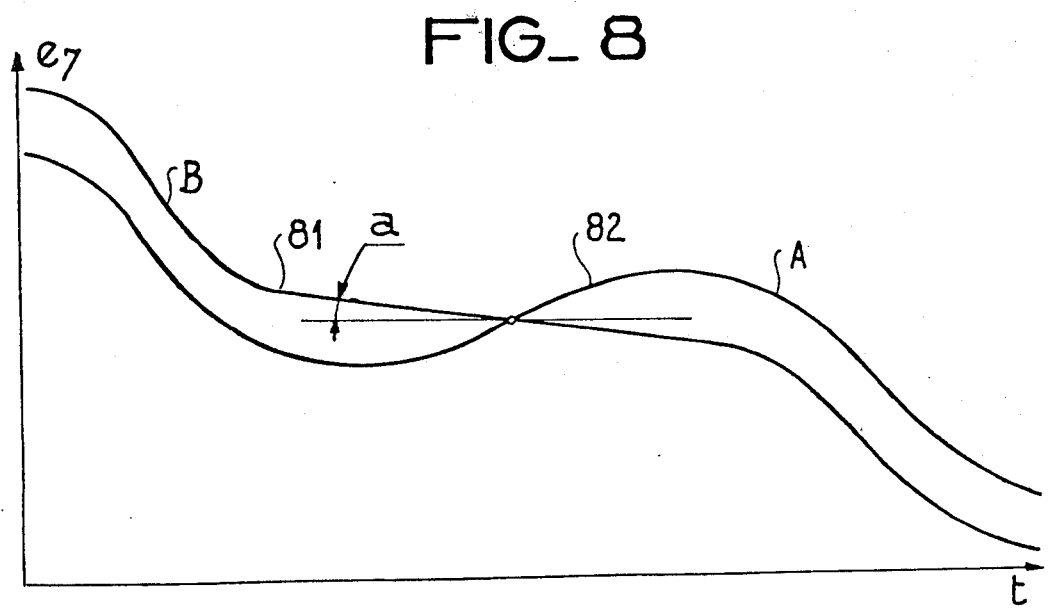
FIG_8

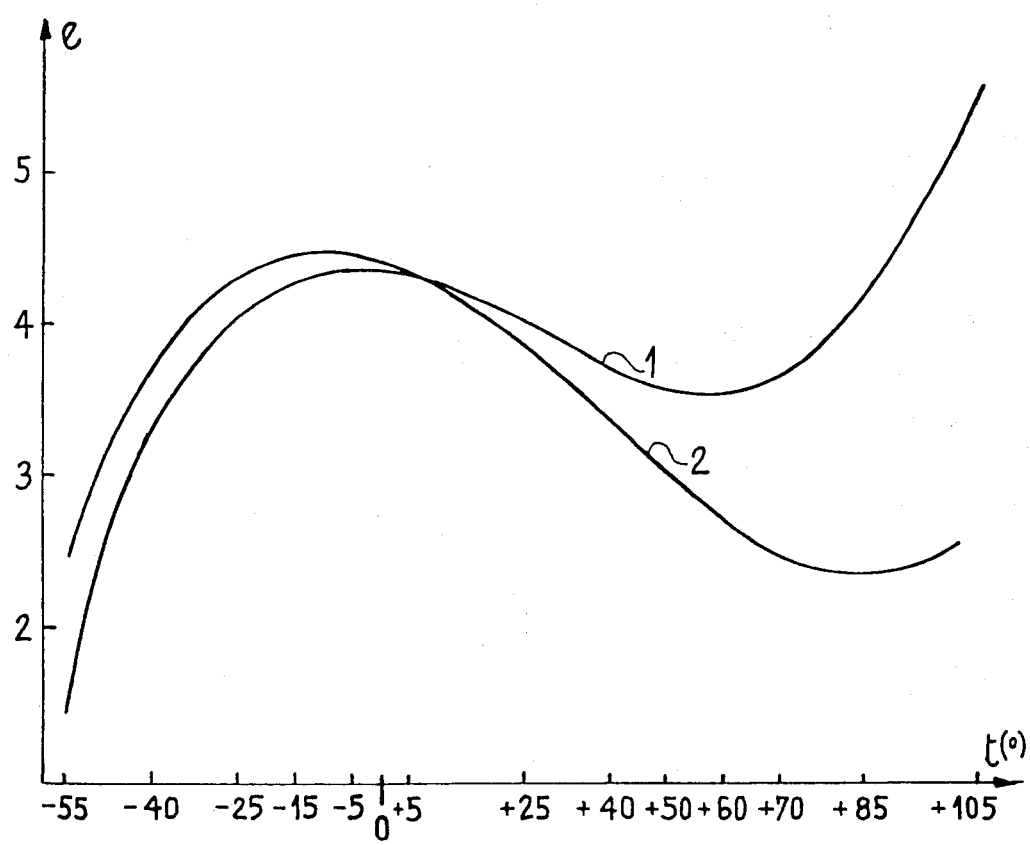

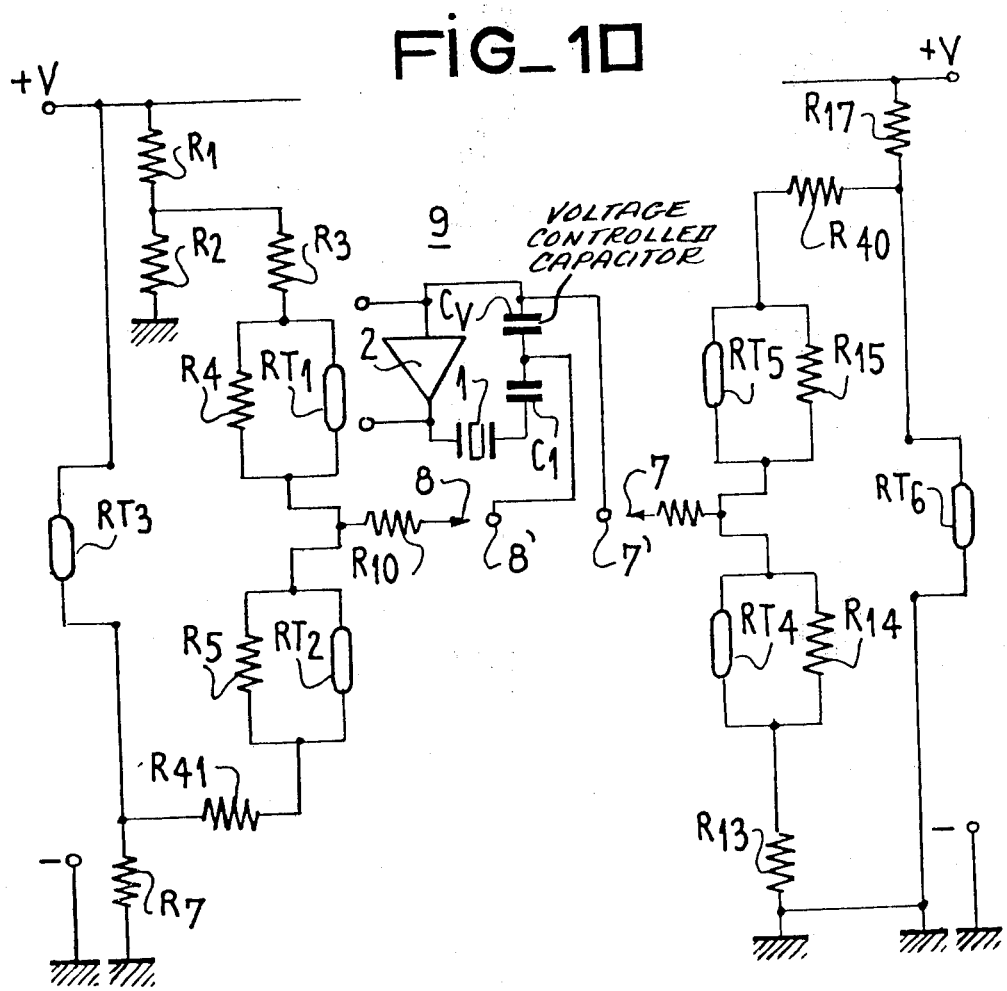

TEMPERATURE-COMPENSATED CRYSTAL OSCILLATOR

BACKGROUND OF THE INVENTION

The present invention relates to crystal oscillators with frequency regulation as a function of the temperature. These oscillators essentially comprise an amplifier, whose output is connected to the input across a circuit incorporating an oscillating piezoelectric crystal, the gain of the system with the thus formed feedback loop being higher than unity in order to satisfy auto-oscillation conditions. The frequency regulation as a function of temperature is obtained by connecting in series with the crystal a capacitor of appropriate value, whose capacitance varies as a function of a voltage applied to its foils and by creating said voltage, normally called the "compensating signal" in a compensating circuit incorporating a heat-sensitive element.

However, the known compensating circuits do not make it possible to industrially obtain a complete frequency regulation in the case where the oscillating crystal has been cut with a particular section, which is advantageous in certain respects and is known under the name AT. Thus, for this section, the thermal drift of the frequency of the crystal affects the shape of a third degree algebraic curve.

In the latter case, it is consequently necessary to create a compensating signal which also varies in accordance with a function of the third degree. This leads to known compensating circuits which are difficult and expensive to produce as a result of the high precision and stability required by the compensating signal to be obtained and the special characteristics required of certain components, such as heat-sensitive elements or thermistors.

In the French Patent of the present Applicant Company filed under No. 74/30338 and published under No. 2,284,219 and equivalent to U.S. Pat. No. 4,020,426 it is proposed to subdivide the curve corresponding to the third degree variation law of the compensating signal into three arcs and to ensure the formation thereof by three separate circuits each having a heat-sensitive element.

For this purpose, in the said crystal oscillator constituted by an oscillating circuit in the form of a feedback loop and incorporating an amplifier, an oscillating piezoelectric crystal and an element having a reactance which is variable as a function of electrical signals or quantities, the electrical compensating signal or quantity is created by a circuit having two terminals, one kept operating at a fixed potential by a dividing bridge and the other raised to a potential variable as a function of the temperature. First and second heat-sensitive elements are connected then by one of their ends to said other terminal, their other end being respectively connected to two dividing bridges, whereof one comprises a third of said elements, the three points being connected to the terminals of the said power supply.

Thus, at around 30 MHz, this prior art oscillator supplies a frequency stability as a function of the temperature of approximately $10^{-6}$ in the temperature range of $-40°$ to $+80°$ C.

However, for certain uses such as avionics, the temperature ranges to be covered are even wider and are typically between $-55°$ and $+105°$ C. The temperature compensating circuit of the aforementioned prior art does not satisfy such a requirement. The correction voltage curve supplied by said circuit as a function of the temperature has two inflection points with a direction change of the curvature, respectively on either side of the limit temperature ($-40°$ to $+80°$ C.).

A partial solution can be envisaged, such as an increase in the supply voltage of the circuit but has the disadvantage of increasing the potential at the terminals of the capacitor which is variable as a function of the voltage, i.e. the sensitivity thereof is reduced. Moreover, beyond 70° C., the thermistors have a too limited resistance variation as a function of the temperature.

BEST SUMMARY OF THE INVENTION

The oscillator according to the present invention does not have these disadvantages. Thus, instead of the fixed value dividing bridge of the aforementioned patent specification applying in operation a fixed potential to one of the terminals of the compensating circuit, it uses a dividing bridge whose value varies as a function of the temperature and incorporating thermistors in addition to resistors. Thus, a variable potential is applied to said terminal forming a complementary compensating voltage. This complementary compensating circuit more paticularly acts at the ends of the temperature range and does not significantly change the compensating voltage variation law in the median range of frequencies.

According to a particularly advantageous constructional variant, the complementary compensating circuit is structurally constituted by the same elements as the compensating circuit of the aforementioned prior art, said second circuit being reversed in its connecting terminals to the power supply. This variant leads to an improvement in the compensating voltage variation curve for the median range of frequencies.

The invention more specifically relates to a crystal oscillator with frequency regulation in a wide range of temperatures with an oscillating circuit in the form of a feedback loop comprising an amplifier, an oscillating piezoelectric crystal and a capacitor variable as a function of the voltage and a two-part compensating circuit connected to the terminals of a d.c. supply, each part having elements whose electrical resistance is dependent on the temperature, said circuit supplying at its terminals a compensating signal applied to the variable capacitor, one of the terminals being raised to a main compensating potential by a main part of the circuit constituted by first and second said elements connected by one of their ends to said terminal, their other end being respectively connected to two dividing bridges, whereof one incorporates a third of said elements, the two bridges being connected to the terminals of the power supply, wherein the other of the terminals is arranged to a complementary compensating potential by the other part of the compensating circuit, said compensating signal resulting from the difference between the main and complementary potentials.

BRIEF DESCRIPTION OF THE DRAWINGS

The invention is described in greater detail hereinafter relative to non-limitative embodiments and with reference to the attached drawings, wherein show:

FIG. 1 a diagrammatic view of the prior art compensating circuit.

FIG. 2 the variation curve of the compensating voltage as a function of temperature supplied by the circuit of FIG. 1.

FIG. 3 a partial diagrammatic view of the complementary compensating circuit according to the invention.

FIGS. 4A and 4B two explanatory diagrams corresponding to the two aforementioned cases.

FIGS. 5A and 5B two explanatory diagrams corresponding to the two aforementioned cases.

FIGS. 6A, 6B and 6C three diagrams with FIG. 6C showing the variation curves of the final compensating voltage compared with the main and complementary compensating curves FIGS. 6A and 6B.

FIG. 7 a variant of the compensating circuit according to the invention having two reversed circuits.

FIG. 8 in rectangular axes, the voltage curves supplied by the complementary compensating circuit.

FIG. 9 in rectangular axes, the total compensating voltage curve resulting from the difference between the main and complementary compensating voltages.

FIG. 10 another embodiment of the compensation circuit according to the invention.

DETAILED DESCRIPTION OF THE PREFERRED EMBODIMENTS

FIG. 1 is a diagrammatic view of the compensating circuit according to the prior art. The oscillator is constituted in per se known manner by a feedback loop incorporating a piezoelectric crystal 1, an amplifier 2 and two capacitors $C_1$ and $C_V$ which, with the crystal, determine the oscillating frequency. One of the capacitors $C_V$ is of the type known under the varicap and its value varies in accordance with the value of a d.c. voltage applied to its terminals shown at 7' and 8'. The control voltages of this capacitor are created at its terminals by the outputs 7 and 8 of the compensating circuit, whose output 8 supplies a voltage $e_8$ variable as a function of the temperature. The voltage $e_7$ of output 7 is at constant value and is produced by the dividing bridge 10 bounded by dashes.

The potential difference ($e_8 - e_7$) between outputs 8 and 7 modifies the capacitance value of the varactor-type capacitor and consequently, appropriate values of the compensating circuit elements, can compensate variations in the frequency supplied by the crystal oscillator as a function of temperature.

FIG. 2 shows in a diagram in rectangular axes the variation curve of the compensating voltage as a function of the temperature supplied by the prior art circuit of FIG. 1.

In this curve, the temperatures are plotted on the abscissa and the compensating voltages on the ordinate and towards the two ends of the temperature range the curve has two inflexion points P1 and P2 on either side of which it is no longer possible to obtain the compensation. The necessary curve arcs $A_1,A_2$ are replaced by curve arcs $B_1,B_2$.

Thus, in the prior art, the temperature range is limited to that defined by the inflexion points and in practice these limits are $-40°$ to $+80°$ C.

FIG. 3 shows in a partial diagrammatic view the complementary compensating circuit according to the invention. This circuit which takes the place of the dividing bridge bounded in dashes 10 in FIG. 1 serves to create a voltage $e_7$, which varies as a function of the temperature in accordance with a variation law such that the compensating voltage $e=e_8-e_7$ applied to the varactor-type capacitor has its inflexion points $P_1$, $P_2$ for much more widely varying temperature values than in the prior art.

As compared with the dividing bridge $R_{12}R_{13}$ in FIG. 1, the circuit has two thermistors $RT_4$ and $RT_5$ in series in the branch of $R_{13}$ connected to the negative terminal of the power supply, one of the two thermistors $RT_5$ being shunted by a resistor $R_{14}$. The operation of such a complementary compensating circuit is apparent from FIGS. 4 and 5.

FIGS. 4A and 4B illustrate the operation at low and high temperatures.

At low temperatures, the value of thermistor $RT_5$ is very high compared with that of resistor $R_{14}$. Thus, the circuit can be represented as in FIG. 4A where blocks 12 and 13 represent resistive elements which do not vary as a function of temperature.

At the limits with $RT_4$ approaches infinity $e_7$ assumes a value close to $V_A$, whilst for $RT_4$ zero $e_7 = -V_A \times R_{13}/(R_{12}+R_{13})$.

This variation of $e_7$ is given in FIG. 5A in the curve in rectangular marked I. At high temperatures, the value of thermistor $RT_4$ is negligible compared with that of the other elements of the circuit. Thus, the circuit can be represented as in FIG. 4B where the blocks 12 and 15 represent the resistive elements which do not vary as a function of the temperature.

As hereinbefore, the limit values for $RT_5$, respectively infinity and zero give the variation limits of voltage $e_7$. This variation of $e_7$ is given in FIG. 5B on the curve in rectangular axes marked II.

FIGS. 6A, 6B and 6C show in rectangular axes, the variations of the final compensating voltage in FIG. 6C by comparison with the curves in FIGS. 6A and 6B for the main and complementary compensation respectively.

FIG. 6A is identical to that of FIG. 2 which is of the compensating voltage $e_8$ supplied by the circuit of the prior art while FIG. 6B is that of the compensating voltage $e_7$ supplied by the complementary compensating circuit of FIG. 3. This curve comprises the extreme arcs described hereinbefore located on either side of the central part where the circuit of FIG. 3 has little influence. Its only influence is indicated by the slope of the curve of FIG. 6A in the sense of reductions towards high temperatures.

FIG. 6C shows the final compensating voltage ($e_8 - e_7$) applied to the varactor-type capacitor of the oscillator. Voltage e is represented graphically, to within a constant length, by the length of segment GH determined on a vertical line by the intersection with the curves of FIGS. 6A and 6B. It can be seen that the curve of FIG. 6C no longer has inflexion points at the end of the temperature range and that its centres of curvature there are always on the same side of the tangent. The overall compensation curve consequently satisfies the conditions indicated hereinbefore for the extension of the temperature range where compensation is ensured.

To give an idea of values, the range of temperatures where compensation is ensured then extends from $-55°$ to $+105°$ C. for a compensation of $10^{-6}$ of the frequency.

FIG. 7 shows a particularly advantageous variant of the complementary compensating circuit according to the invention. The results obtained as a result of this circuit can be observed on the diagram in rectangular axes of FIG. 8.

The complementary compensating circuit of FIG. 3 creates, in the manner indicated hereinbefore a low value gradient in the medium part of the curve of the compensating voltages shown in FIG. 6, which is to be avoided in certain cases. The variant of FIG. 7 creates no gradient in this median part.

It is constituted by a complementary compensating circuit which, according to the invention, is structurally identical to the compensating circuit of the aforementioned prior art, but is reversed with regard to its connection to the power supply and the resistive voltage divider corresponding to $R_1 - R_2$ has been deleted. The values of the elements from which it is formed are determined in such a way that the complementary compensating voltage $e_7$ is only a fraction of the main compensating voltage $e_8$.

FIG. 8 shows in rectangular axes the curve A of the complementary compensating voltage $e_7$ obtained, as a function of the temperature at the terminals of the reversed circuit of FIG. 7. It is possible to see that compared with the corresponding curve of FIG. 6B obtained with the embodiment of FIG. 3, the slope A of the curve in the median part 81 is replaced by a slightly undulating part 82, which advantageously approaches a horizontal level which is more favourable in certain cases.

FIG. 9 represents in rectangular axes the total compensating voltage variations $e = e_8 - e_7$ obtained in the respective cases of the prior art compensating circuit and the two compensating circuits according to the present invention. It can be seen that for the same temperature limits, namely $-55°$ to $+105°$ C., the variations in the voltage e to be made for the compensation are reduced much more in the case of the invention, typically 2.369 V to 4.425 V than in the prior art, typically 1.499 V to 5.662 V.

FIG. 10 shows the best example of a circuit according to the invention, giving the best results as shown in FIG. 8.

On this figure, the same device has the same number as on FIG. 7. Compared to this figure, resistors $R_9$ and $R_{19}$ have been deleted while resistors $R_8$ and $R_{18}$ have been short-circuited. Resistors $R_{41}$ and $R_{40}$ have been respectively introduced between the common connection points of $R_7$, $RT_3$ and $R_5$, $RT_2$ on one hand, and the common connection points of $R_{17}$, $RT_6$ and $RT_5$, $R_{15}$, on the other hand.

With the circuit represented on this figure, we have obtained better results than in the case of FIG. 7, in order to stabilize the frequency of oscillations within a wide range of temperature.

What is claimed is:

1. A crystal oscillator with frequency regulation over a wide temperature range comprising:

an oscillating circuit in the form of an amplifier, an oscillating piezoelectric crystal and a capacitor variable as a function of applied voltage; and a two-part compensating circuit adapted for connection to the terminals of a d.c. power supply and having first and second output terminals for supplying to said capacitor a compensating signal including:

(1) a main circuit part for supplying a potential to said first output terminal and constituted by first and second elements whose electrical resistance is dependent upon temperature each connected at one end to said first output terminal, and two voltage dividers each connected, respectively, to the other end of one of said first and second elements, one of said dividers including a third element whose electrical resistance is dependent upon temperature and said dividers having respective terminals for connection to a power supply; and (2) a complementary circuit part for supplying a potential to said second output terminal including a voltage divider constituted by fourth and fifth serially connected elements whose electrical resistance is dependent upon temperature, said elements being connected to said second output terminal and at one end to each other, a first fixed resistor shunting one of said fourth and fifth elements, second and third fixed resistors respectively connected at one end to the other end of said fourth and fifth elements and having a terminal at the other end for connection to respective terminals of said power supply, said compensating signal being the difference between the voltages at said output terminals.

2. An oscillator as in claim 1, wherein said complementary circuit part includes a sixth element whose electrical resistance is dependent upon temperature, a fourth fixed resistor shunting said sixth element, means for connecting said sixth element between said one end of said second resistor and said other end of said third resistor, and a fifth fixed resistor shunting the other of said fourth and fifth elements.

3. An oscillator as in claim 1, wherein said complementary circuit part includes a sixth element whose electrical resistance is dependent upon temperature, a fourth fixed resistance having a terminal at one end for connecting the other end of said third resistor to one of said terminals of said power supply, with the junction therebetween connected to one end of said sixth element and means for connecting the other end of said sixth element to the other of said terminals of said power source.

4. An oscillator as in claim 1, wherein said elements are thermistors.

* * * * *